(12) United States Patent  (10) Patent No.: US 8,194,710 B2
Ishikawa                    (45) Date of Patent:     Jun. 5, 2012

(54) SEMICONDUCTOR LASER WITH HEATER (75) Inventor: Tsutomu Ishikawa, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 234 days.

(21) Appl. No.: 12/571,846

(22) Filed: Oct. 1, 2009

(65) Prior Publication Data

US 2010/0040101 A1    Feb. 18, 2010

Related U.S. Application Data (62) Division of application No. 11/727,952, filed on Mar. 29, 2007, now abandoned.

(30) Foreign Application Priority Data

Mar. 30, 2006 (JP) .................. 2006-095317
Mar. 22, 2007 (JP) .................. 2007-075651

(51) Int. Cl.
    *H01S 5/00* (2006.01)
(52) U.S. Cl. ................. 372/46.014; 372/50.11
(58) Field of Classification Search ........... 372/46.014, 372/50.11
    See application file for complete search history.

(56) References Cited

U.S. PATENT DOCUMENTS

| 5,642,371 A | 6/1997 | Tohyama et al. |
| 2004/0257579 A1 | 12/2004 | Shirai et al. |
| 2005/0111778 A1 | 5/2005 | Takahashi |

FOREIGN PATENT DOCUMENTS

| EP | 0 465 914 A2 | 1/1992 |
| EP | 1 536 275 A1 | 6/2005 |
| JP | 6-97602 A | 4/1994 |
| JP | 6-97604 A | 4/1994 |
| JP | 6-268320 A | 9/1994 |
| JP | 7-66487 A | 3/1995 |
| JP | 9-92934 A | 4/1997 |
| JP | 2000-206476 A | 7/2000 |

OTHER PUBLICATIONS

Japanese Office Action dated Apr. 16, 2010, issued in corresponding Japanese Patent Application No. 2007-075651.
Kameda et al., T.: "A DBR Laser Employing Passive-Section Heaters, With 10.8 NM Tuning Range and 1.6 MHZ Linewidth" IEEE Photonics Technology Letters, IEEE Service Center, Piscataway, NK, US, vol. 5, No. 6, Jun. 1, 1993, pp. 608-610.
Extended European Search Report dated Jul. 30, 2007 issued in corresponding European Application No. 07104934.0

*Primary Examiner* — Jessica Stultz
*Assistant Examiner* — Marcia Golub-Miller
(74) *Attorney, Agent, or Firm* — Westerman, Hattori, Daniels & Adrian, LLP (57) ABSTRACT

An optical semiconductor device has a semiconductor substrate, a semiconductor region and heater. The semiconductor region has a stripe shape demarcated with a top face and a side face thereof. The stripe shape has a width smaller than a width of the semiconductor substrate. An optical waveguide layer is located in the semiconductor region. A distance from a lower end of the side face of the semiconductor region to the optical waveguide layer is more than half of the width of the semiconductor region. The heater is provided above the optical waveguide layer.

11 Claims, 13 Drawing Sheets

PRIOR ART

SEMICONDUCTOR LASER WITH HEATER

RELATED APPLICATIONS

This application is a divisional of U.S. patent application Ser. No. 11/727,952 filed Mar. 29, 2007.

BACKGROUND OF THE INVENTION

1. Field of the Invention

This invention generally relates to an optical semiconductor device.

2. Description of the Related Art

Generally, a wavelength-tunable semiconductor laser has a gain for a laser emission and can select a wavelength of the laser. There are some methods of selecting a wavelength. For example, the methods include a method of changing a resonant wavelength of loss or gain by changing a refractive index or angle of a diffractive grating or an etalon provided in a laser cavity. And the methods include a method of changing a resonant wavelength of the laser cavity by changing an optical length in the laser cavity (refractive index or a physical length of the laser cavity).

The method of changing the refractive index has an advantage in reliability or manufacturing cost, because a mechanical operating portion is not necessary being different from the method of changing the angle or length. The refractive index changing method includes changing a temperature of an optical waveguide, changing a carrier density in the optical waveguide by providing a current, and so on. A semiconductor laser having a Sampled Grating Distributed Reflector (SG-DR) is supposed as a wavelength tunable laser that changes a temperature of an optical waveguide, where the SG-DR has a wavelength selection function.

In this semiconductor laser, if a reflection spectrum of a plurality of SG-DR regions (reflection region) is controlled preferably, a predetermined wavelength can be selected with a vernier effect. That is, this semiconductor laser emits a laser light at a wavelength where reflection peaks of two SG-DR regions are overlapped with each other. It is therefore possible to control the lasing wavelength by controlling each of the reflection peaks of the SG-DR regions.

Generally, a heater is provided on a surface of the SG-DR region. The temperature of the optical waveguide of the SG-DR region is changed when the heater generates heat. As a result, the refractive index of the SG-DR region changes. It is therefore possible to control the reflection peak wavelength of the SG-DR region by controlling the heating value of the heater. The heater needs an electrical power when generating heat. And so, Japanese Patent Application Publication No. 9-92934 discloses a method of controlling a refractive index of a reflection region by providing an electrical power to a heater.

Here, a wavelength controllable range of the reflection peak is proportional to an amount of refractive index change of the optical waveguide, that is, an amount of temperature change of the optical waveguide. It is necessary to enlarge the electrical power to be provided to the heater in order to enlarge the wavelength controllable range. However, it is preferable that the semiconductor laser is controlled with low electrical power, due to an optical system's requirement. It is therefore difficult for the heater to generate sufficient heat which enlarges the wavelength controllable range of the semiconductor laser.

SUMMARY OF THE INVENTION

The present invention provides an optical semiconductor device in which heat generated by a heater is provided to an optical waveguide effectively.

According to an aspect of the present invention, preferably, there is provided an optical semiconductor device including a semiconductor substrate, a semiconductor region and a heater. The semiconductor region has a stripe shape demarcated with a top face and a side face thereof. The stripe shape has a width smaller than a width of the semiconductor substrate. An optical waveguide layer is located in the semiconductor region. A distance from a lower end of the side face of the semiconductor region to the optical waveguide layer is more than half of the width of the semiconductor region. The heater is provided above the optical waveguide layer.

With the above-mentioned configuration, thermal resistance in the semiconductor region is large because the width of the semiconductor region is smaller than that of the semiconductor substrate. In this case, the heater can heat the optical waveguide layer effectively. The distance between the optical waveguide layer and the semiconductor substrate is sufficiently large because the distance from the lower end of the semiconductor region to the optical waveguide layer is more than half of the width of the semiconductor region. It is therefore possible to limit the diffusion of the heat having conducted through the optical waveguide layer. And the temperature gradient in the optical waveguide layer is sufficiently large. Accordingly, it is possible to control the temperature of the optical waveguide layer effectively with the heat generated by the heater.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1:
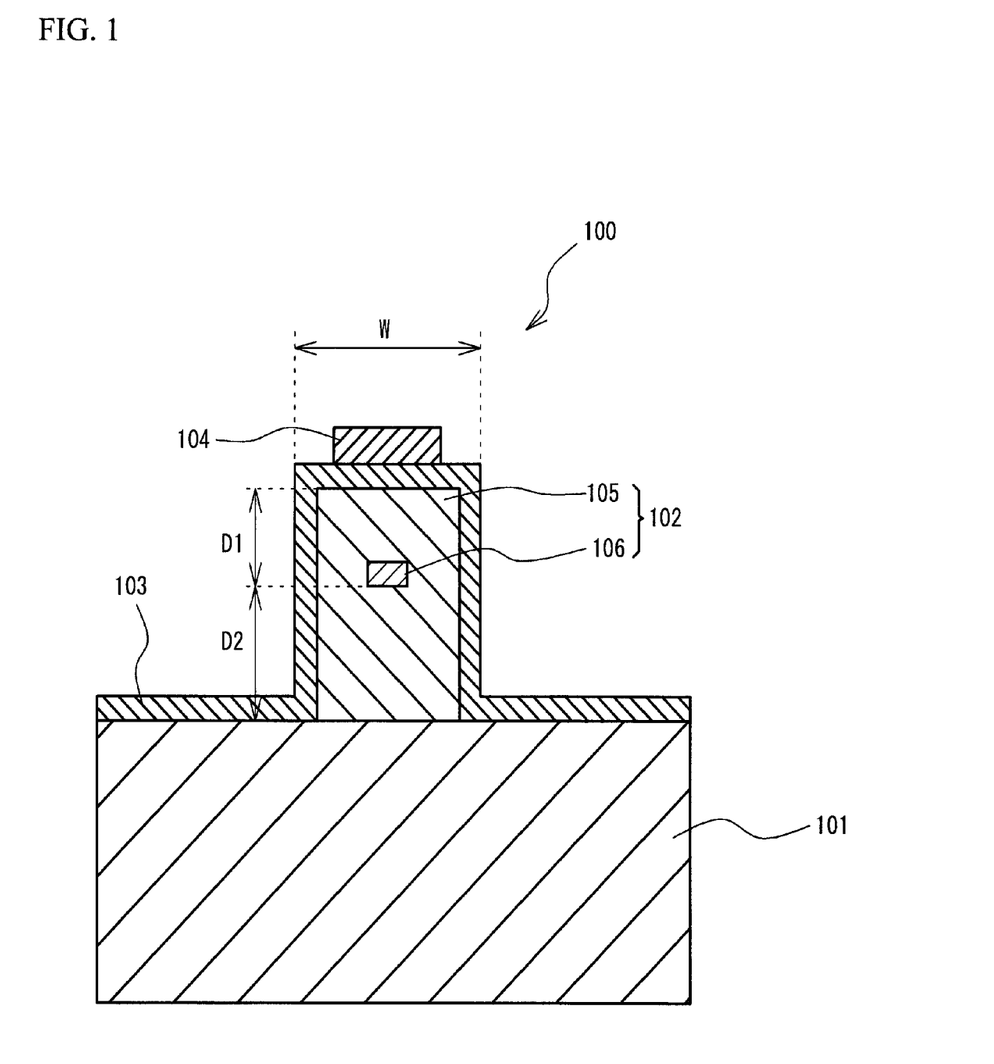
FIG. 1 illustrates a cross sectional view of a distributed reflector in accordance with a first embodiment of the present invention.

In a first embodiment, a description will be given of a distributed reflector as an example of an optical semiconductor device in accordance with the present invention. FIG. 1 illustrates a cross sectional view of a distributed reflector 100 in accordance with the first embodiment. As shown in FIG. 1, the distributed reflector 100 has a structure in which a mesa semiconductor region 102 is provided on a center area of a semiconductor substrate 101, where the mesa semiconductor region 102 has a stripe mesa shape and a width smaller than that of the semiconductor substrate 101. That is, the mesa semiconductor region 102 is projecting from the center area of the semiconductor substrate 101.

An insulating layer 103 is formed on a top face and a side face of the mesa semiconductor region 102 and on an exposed top face of the semiconductor substrate 101. The insulating layer 103 acts as a passivation film. The semiconductor substrate 101 is, for example, composed of InP. The insulating layer 103 is, for example, composed of an insulator such as $SiO_2$, SiN, and the insulator has a thermal conductivity lower than that of the mesa semiconductor region 102. A heater 104 is provided on the insulating layer 103 above the mesa semiconductor region 102.

The mesa semiconductor region 102 has a structure in which an optical waveguide layer 106 is formed at a center area of a cladding region 105. The cladding region 105 is, for example, composed of InP. The cladding region 105 confines a light traveling in the optical waveguide layer 106. The optical waveguide layer 106 is, for example, composed of a material having an absorption edge wavelength at shorter wavelengths side compared to a lasing wavelength. The optical waveguide layer 106 is, for example, composed of InGaAsP crystal. The heater 104 is composed of such as NiCr and changes the temperature of the optical waveguide layer 106 according to an electrical power provided thereto. And a refractive index of the optical waveguide layer 106 changes.

Figure 2:
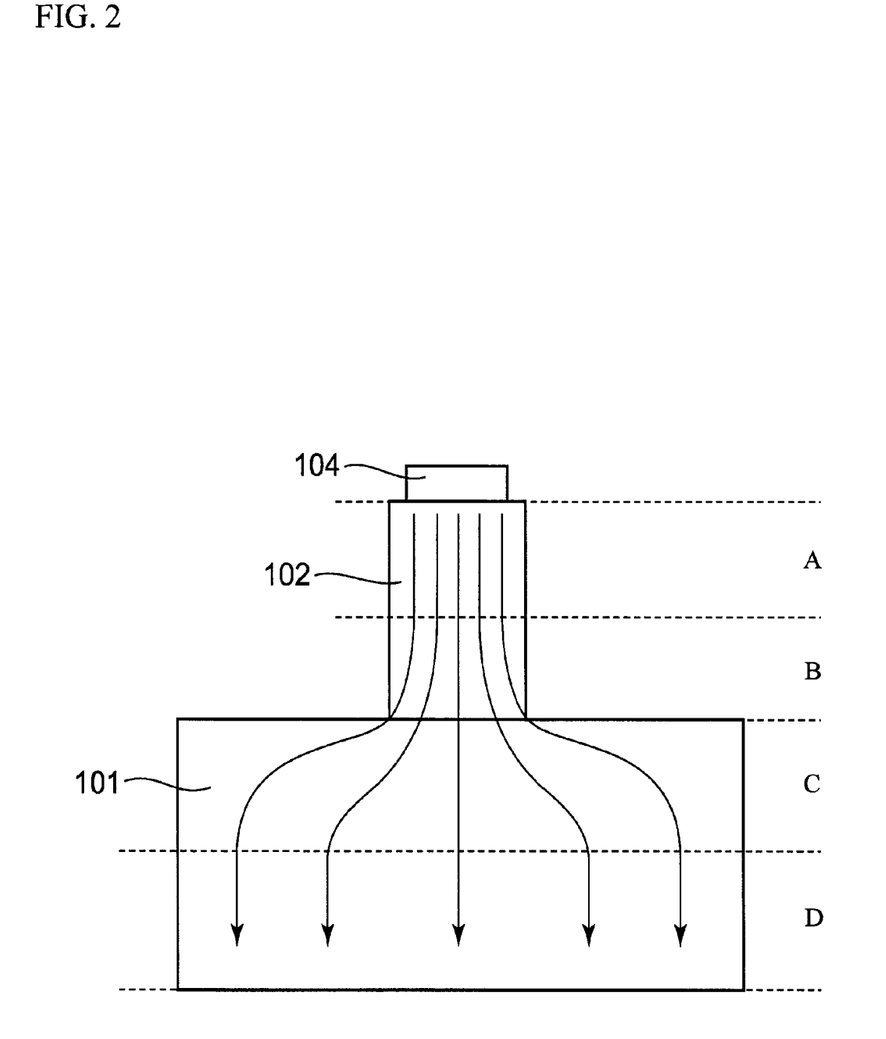
FIG. 2 illustrates a conduction direction of heat from a heater.

A description will be given of a thermal conduction from the heater 104. FIG. 2 illustrates a conduction direction of the heat from the heater 104. The heat generated by the heater 104 is mainly conducted to the mesa semiconductor region 102 and the semiconductor substrate 101, because a thermal conductivity of air is lower than that of the mesa semiconductor region 102.

As shown in FIG. 2, the mesa semiconductor region 102 and the semiconductor substrate 101 are divided into a region A, a region B, a region C and a region D according to the thermal conduction. The region A is an upper region of the mesa semiconductor region 102. The region B is a lower region of the mesa semiconductor region 102 except for the region A. The region C is an upper region of the semiconductor substrate 101. The region D is a lower region of the semiconductor substrate 101 except for the region C.

The heat generated by the heater 104 is conducted downward from the upper end of the region A in a path having a width of the mesa semiconductor region 102. Generally, a relationship between a heat flux P flowing between two points and a temperature differential dT between the two points is shown as dT=P×Rth. Here, Rth is a thermal resistance. Rth is proportional to a length of a path where heat flows and is inversely proportional to a cross sectional area of the path. The temperature differential dT is proportional to the thermal resistance Rth when heat flux from a heater (or electrical power provided to the heater) is substantially constant. A temperature differential per unit length, a temperature gradient, is enlarged as the cross sectional area of the path is reduced.

Here, the thermal resistance or the temperature gradient of the region A is large, because the width of the mesa semiconductor region 102 is smaller than that of the semiconductor substrate 101. The heat conducted to the lower end of the region A is conducted downward in the region B. The region B is a lower region of the mesa semiconductor region 102 and is closer to the semiconductor substrate 101. And in the region B, the heat is conducted radially toward the semiconductor substrate 101 because of influence of the semiconductor substrate 101. Accordingly, the temperature gradient gets lower in the region B as closer to the semiconductor substrate 101.

The heat conducted to the lower end of the region B is conducted downward in the region C. In the region C, the heat is conducted downward so as to spread in the width direction of the semiconductor substrate 101. The temperature gradient is therefore reduced drastically in the region C. The heat conducted to the lower end of the region C is conducted downward in the region D. In the region D, the temperature gradient is converged to a given small value, because the heat is sufficiently spread in the width direction of the semiconductor substrate 101.

As mentioned above, the heat generated by the heater 104 is provided to the optical waveguide layer 106 effectively, because the width of the mesa semiconductor region 102 is smaller than that of the semiconductor substrate 101. In the embodiment, a distance D2 between the optical waveguide layer 106 and the lower end of the mesa semiconductor region 102 is more than half of a width W of the mesa semiconductor region 102. The width W is a width of a part of the mesa semiconductor region 102 where the optical waveguide layer 106 is provided. The width of the semiconductor substrate 101 is, for example, 300 μm. The width W is, for example, 10 μm. A distance D1 from the upper end of the mesa semiconductor region 102 to the optical waveguide layer 106 is, for example, 3 μm. The distance D2 is, for example, 7 μm.

Here, the distance D2 in other mesa semiconductor region not intended for thermal efficiency is generally smaller than 2 μm, and the other mesa semiconductor region is different from that of the present invention.

In the embodiment, the lower end of the mesa semiconductor region 102 corresponds to the bottom of the mesa semiconductor region 102 having a stripe shape. Therefore, the lower end of the mesa semiconductor region 102 is positioned at an interface between the semiconductor substrate 101 and the mesa semiconductor region 102. If the bottom of the mesa semiconductor region 102 is positioned at a position higher than the interface, the bottom of the mesa semiconductor region 102 is positioned at a position higher than the interface. And if the bottom of the mesa semiconductor region 102 is positioned at a position lower than the interface, the bottom of the mesa semiconductor region 102 is positioned at a position lower than the interface. In this case, the mesa semiconductor region 102 includes a part of the semiconductor substrate 101.

In this case, the distance between the optical waveguide layer 106 and the semiconductor substrate 101 is sufficiently large. It is therefore possible to limit the diffusion of the heat having conducted through the optical waveguide layer 106. And the temperature gradient in the optical waveguide layer 106 is sufficiently large. It is therefore possible to control the temperature of the optical waveguide layer 106 effectively with the heat generated by the heater 104.

Second Embodiment

Figure 3:
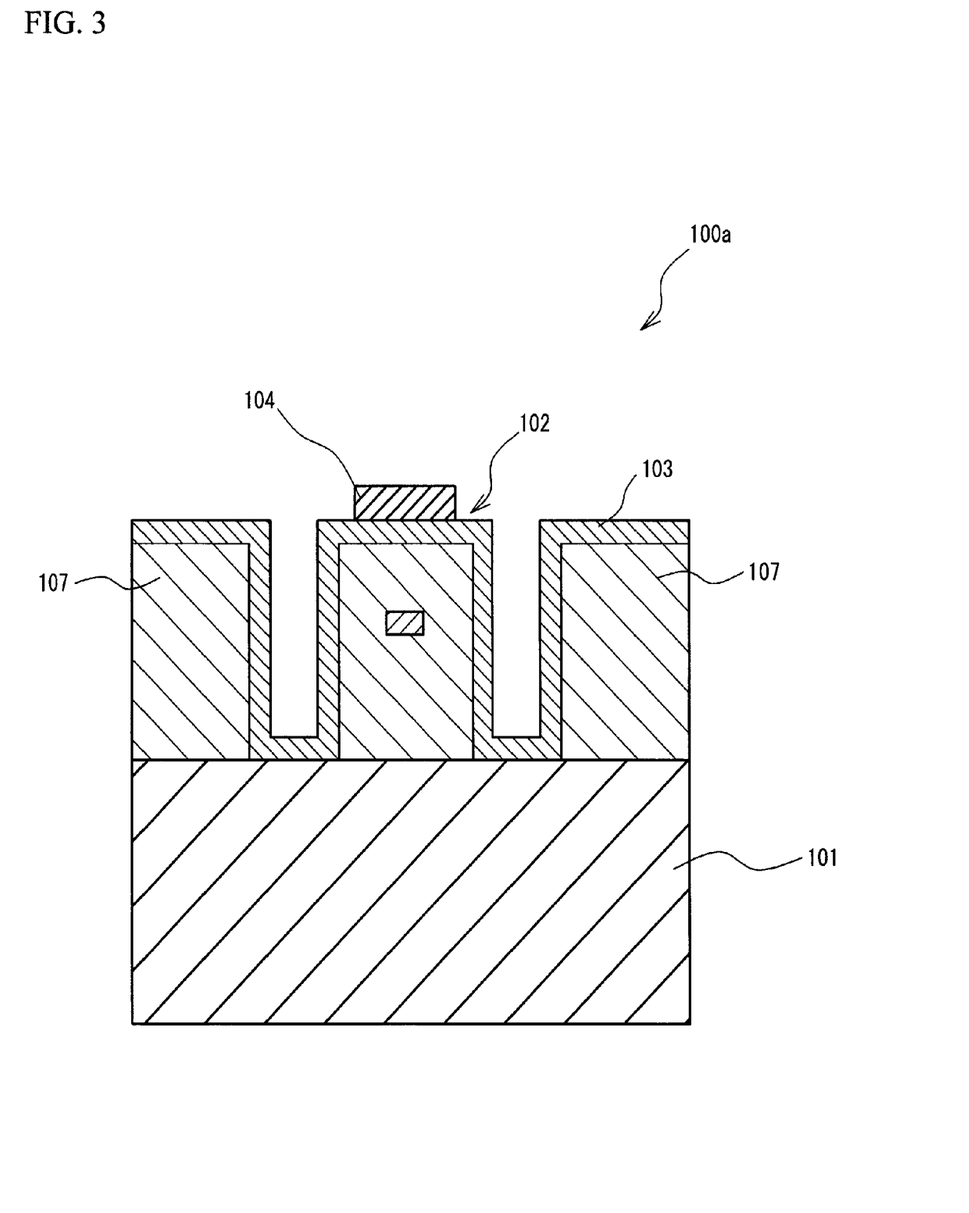
FIG. 3 illustrates a cross sectional view of a distributed reflector in accordance with a second embodiment of the present invention.

Next, a description will be given of a distributed reflector 100a in accordance with a second embodiment of the present invention. FIG. 3 illustrates a cross sectional view of the distributed reflector 100a. The distributed reflector 100a has a surrounding semiconductor region 107, being different from the distributed reflector 100 shown in FIG. 1. As shown in FIG. 3, the surrounding semiconductor region 107 is arranged at a given interval from the side face of the mesa semiconductor region 102. That is, the distributed reflector 100a has a structure in which a groove is formed between the mesa semiconductor region 102 and the surrounding semiconductor region 107. The surrounding semiconductor region 107 is, for example, composed of InP. The insulating layer 103 is formed on the top face and the side face of the mesa semiconductor region 102 and on the top face and the side face of the surrounding semiconductor region 107.

In the embodiment, the heat generated by the heater 104 is mainly conducted to the mesa semiconductor region 102 and the semiconductor substrate 101, because there is a space between the mesa semiconductor region 102 and the surrounding semiconductor region 107. It is therefore possible to control the temperature of the optical waveguide layer 106 effectively with the heat of the heater 104.

Third Embodiment

Figure 4:
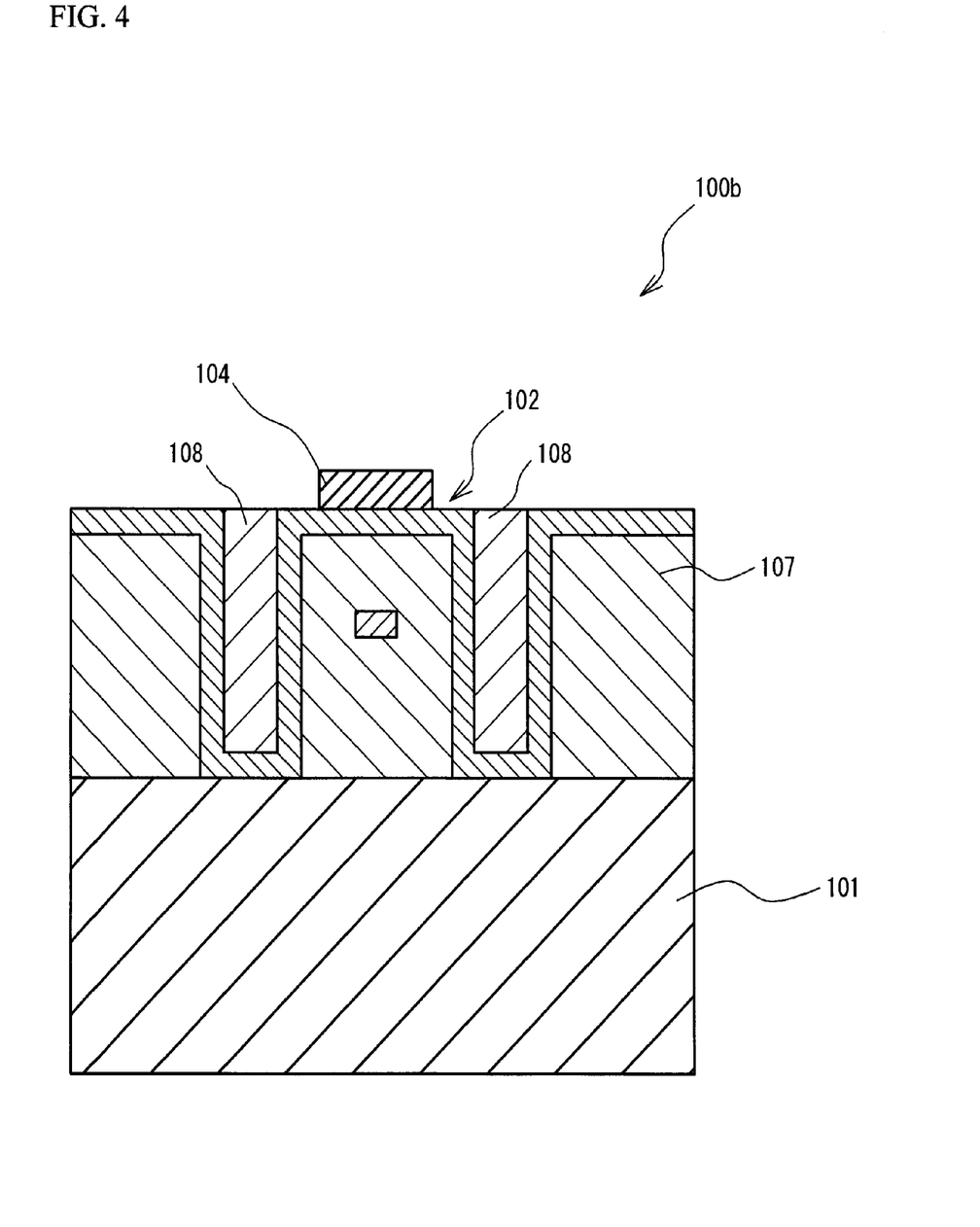
FIG. 4 illustrates a cross sectional view of a distributed reflector in accordance with a third embodiment of the present invention.

Next, a description will be given of a distributed reflector 100b in accordance with a third embodiment of the present invention. FIG. 4 illustrates a cross sectional view of the distributed reflector 100b. In the distributed reflector 100b, an insulating resin 108 fills the groove between the mesa semiconductor region 102 and the surrounding semiconductor region 107, being different from the distributed reflector 100a shown in FIG. 3. The insulating resin 108 has a thermal conductivity lower than that of the mesa semiconductor region 102. The insulating resin 108 is, for example, composed of polyimide.

In the embodiment, the heat generated by the heater 104 is mainly conducted to the mesa semiconductor region 102 and the semiconductor substrate 101, because the insulating resin 108 is arranged between the mesa semiconductor region 102 and the surrounding semiconductor region 107 and the thermal conductivity of the insulating resin 108 is lower than that of the mesa semiconductor region 102. It is therefore possible to control the temperature of the optical waveguide layer 106 effectively with the heat generated by the heater 104.

In the first embodiment through the third embodiment, the mesa semiconductor region 102 corresponds to the semiconductor region. A part of the cladding region 105 upper than the optical waveguide layer 106 corresponds to the upper cladding layer. A part of the cladding region 105 lower than the optical waveguide layer 106 corresponds to the lower cladding layer. The insulating resin 108 corresponds to the insulator.

Fourth Embodiment

Figure 5:
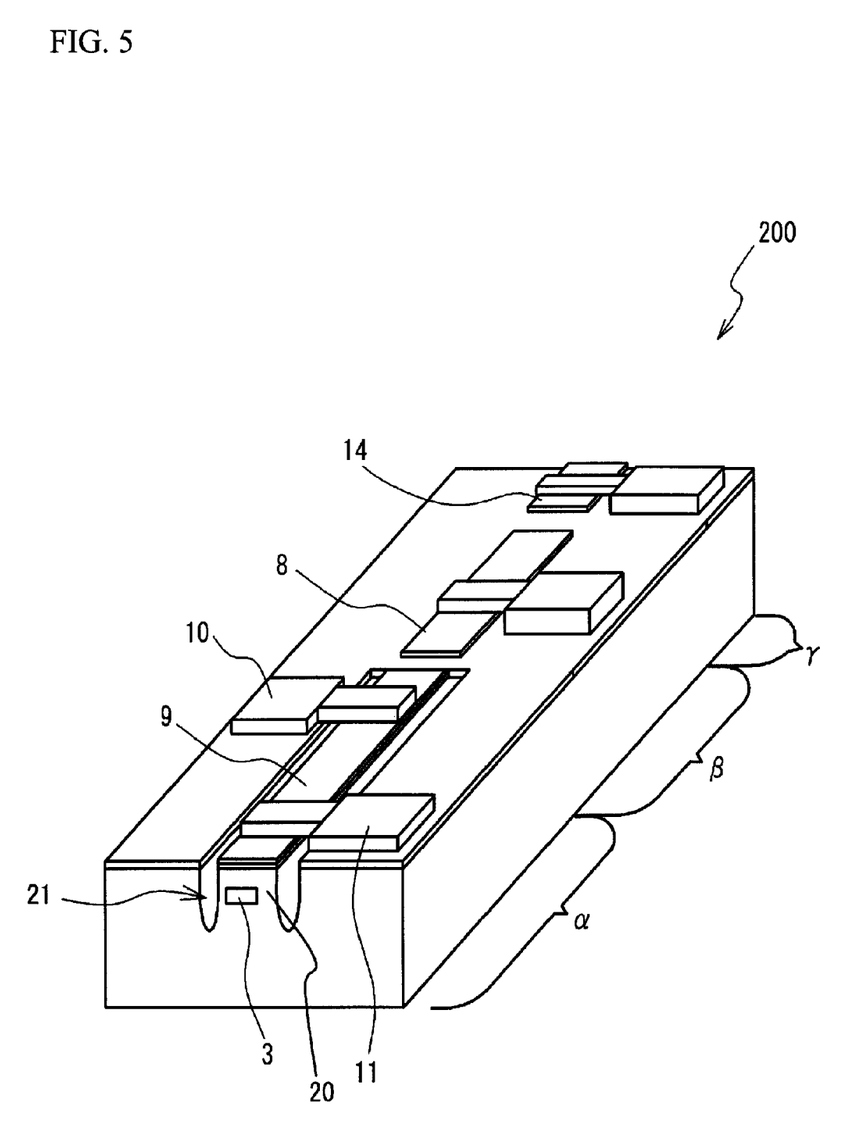
FIG. 5 illustrates a perspective view of a laser chip in accordance with the fourth embodiment of the present invention.
Figure 6A:
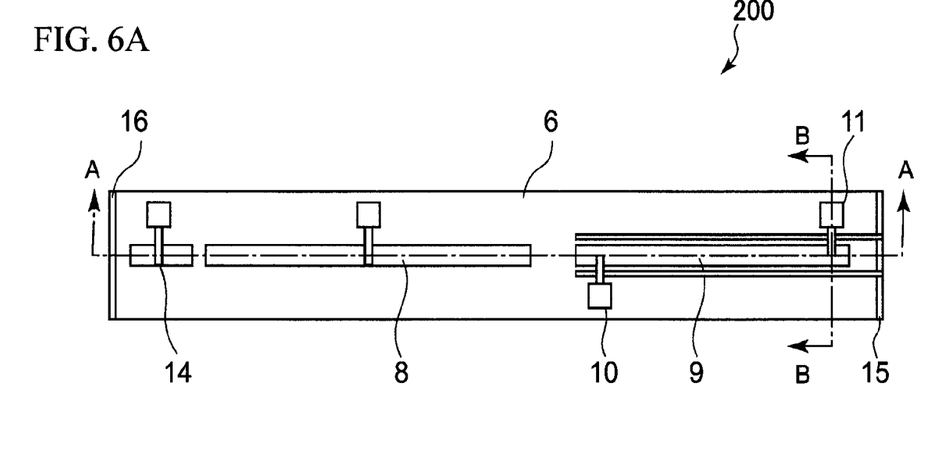
FIG. 6A illustrates a top view of a laser chip in accordance with a fourth embodiment of the present invention.
Figure 6B:
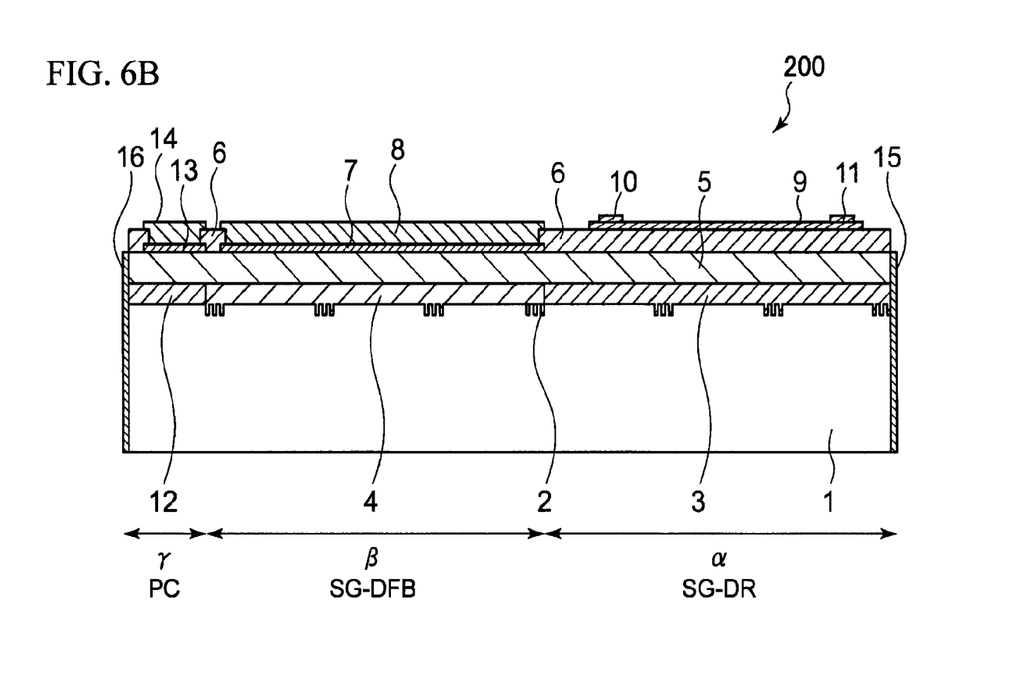
FIG. 6B illustrates a cross sectional view taken along a line A-A of FIG. 6A in accordance with a fourth embodiment of the present invention.

Next, a description will be given of a laser chip 200 in accordance with a fourth embodiment of the present invention. FIG. 5 illustrates a perspective view of the laser chip 200. FIG. 6A illustrates a top view of the laser chip 200. FIG. 6B illustrates a cross sectional view taken along a line A-A of FIG. 6A. A description will be given of the laser chip 200 with reference to FIG. 5, FIG. 6A and FIG. 6B.

As shown in FIG. 5, FIG. 6A and FIG. 6B, the laser chip 200 has a structure in which a Sampled Grating Distributed Reflector (SG-DR) chip structure α, a Sampled Grating Distributed Feedback (SG-DFB) chip structure β and a Power Control (PC) chip structure γ are coupled in order.

The SG-DR chip structure α has a structure in which an optical waveguide layer 3, a cladding layer 5 and an insulating layer 6 are laminated on a semiconductor substrate 1 in order and a thin film resistor 9, a power electrode 10 and a ground electrode 11 are laminated on the insulating layer 6. The SG-DFB chip structure β has a structure in which an optical waveguide layer 4, the cladding layer 5, a contact layer 7 and an electrode 8 are laminated on the semiconductor substrate 1 in order. The PC chip structure γ has a structure in which an optical waveguide layer 12, the cladding layer 5, a contact layer 13 and an electrode 14 are laminated on the semiconductor substrate 1 in order. The semiconductor substrate 1 and the cladding layer 5 of the SG-DR chip structure α, the SG-DFB chip structure β and the PC chip structure γ are a single layer formed as a unit respectively. The optical waveguide layers 3, 4 and 12 are formed on a same plane and are optically coupled.

A low reflecting coating 15 is formed on end facet of the semiconductor substrate 1, the optical waveguide layer 3 and the cladding layer 5 at the SG-DR chip structure α side. On the other hand, a low reflecting coating 16 is formed on end facet of the semiconductor substrate 1, the optical waveguide layer 12 and the cladding layer 5 at the PC chip structure γ side. Diffractive gratings 2 are formed at a given interval in the optical waveguide layers 3 and 4. The sampled grating is thus formed. The insulating layer 6 is further formed between the electrode 8 and the electrode 14.

The semiconductor substrate 1 is, for example, composed of InP. The optical waveguide layer 3 is, for example, composed of InGaAsP crystal having an absorption edge wavelength at shorter wavelengths side compared to the lasing wavelength. PL wavelength of the optical waveguide layer 3 is approximately 1.3 µm. The optical waveguide layer 4 is, for example, an active layer composed of InGaAsP crystal for amplifying a light of a desirable wavelength of a laser emission. The PL wavelength of the optical waveguide layer 4 is approximately 1.57 µm. The optical waveguide layer 12 is, for example, composed of InGaAsP crystal for changing the output of the emitted light by absorbing or amplifying a light. The PL wavelength of the optical waveguide layer 12 is approximately 1.57 µm.

SG-DR segments are formed in the optical waveguide layer 3. Three SG-DR segments are formed in the optical waveguide layer 3 in the embodiment. Here, the SG-DR segment is a region in which one region having the diffractive grating 2 and one space region not having the diffractive grating 2 are combined in the optical waveguide layer 3.

The cladding layer 5 is composed of InP and confines a laser light traveling in the optical waveguide layers 3, 4 and 12. The contact layers 7 and 13 are composed of InGaAsP crystal. The insulating layer 6 is a passivation film composed of an insulator such as SiN, $SiO_2$. The low reflecting coatings 15 and 16 are, for example, composed of a dielectric film including $MgF_2$ and TiON. The reflectivity of the low reflecting coatings 15 and 16 are, for example, less than 0.3%.

The thin film resistor 9 is composed of such as NiCr. The thin film resistor 9 is formed on the insulating layer 6 and extends across above the three SG-DR segments. The power electrode 10 and the ground electrode 11 are coupled to the thin film resistor 9. The power electrode 10, the ground electrode 11, the electrode 8 and the electrode 14 are composed of a conductive material such as Au. As shown in FIG. 5, a mesa groove 21 is formed in a region from one side of the thin film resistor 9 to one side of the optical waveguide layer 3. Another mesa groove 21 is formed in a region from the other side of the thin film resistor 9 to the other side of the optical waveguide layer 3. Each mesa groove 21 extends parallel to the optical waveguide layer 3.

In the embodiment, a mesa semiconductor region 20 is demarcated with the mesa groove 21. As shown in FIG. 5, the mesa groove 21 is formed from both sides of the thin film resistor 9 to the semiconductor substrate 1 passing through both sides of the optical waveguide layer 3. The mesa groove 21 is formed to be parallel to the optical waveguide layer 3. In the embodiment, a mesa semiconductor region 20 corresponds to the mesa semiconductor region 102 of the first embodiment. The mesa semiconductor region 20 is demarcated with the mesa groove 21 and has the optical waveguide layer 3. The mesa semiconductor region 20 having the optical waveguide layer 3 corresponds to the mesa semiconductor region 102 of the first embodiment through the third embodiment. The distance from the lower end of the optical waveguide layer 3 to the lower end of the mesa semiconductor region 20 is more than half of the width of the mesa semiconductor region 20.

Next, a description will be given of an operation of the laser chip 200. At first, a current is provided to the electrode 8. And a light is generated in the optical waveguide layer 4. The light propagates in the optical waveguide layers 3 and 4, and is reflected and amplified repeatedly. Then it causes lasing oscillation. A part of the laser light is amplified or absorbed in the optical waveguide layer 12 and is emitted through the low reflecting coating 16. It is possible to control the gain or the absorptance of the optical waveguide layer 12 with the current provided to the electrode 14. The output of the emitted light is kept constant when a predetermined current is provided to the electrode 14.

When an electrical power is provided to the thin film resistor 9, the temperature of each SG-DR segment is controlled according to the electrical power. Therefore the refractive index of the SG-DR segment changes. And a reflection peak wavelength of the optical waveguide layer 3 changes. It is possible to control the lasing wavelength of the laser chip 200 by controlling the electrical power to be provided to the thin film resistor 9.

It is possible to limit the diffusion of the heat having conducted through the optical waveguide layer 3, because the distance from the lower end of the optical waveguide layer 3 to the lower end of the mesa semiconductor region 20 is more than half of the width of the mesa semiconductor region 20. The temperature gradient in the optical waveguide layer 3 is therefore enlarged sufficiently. And it is possible to control the temperature of the optical waveguide layer 3 effectively with the heat of the thin film resistor 9.

In the embodiment, the SG-DFB chip structure β corresponds to the gain region. The mesa semiconductor region 20 corresponds to the semiconductor region.

Fifth Embodiment

Figure 7:
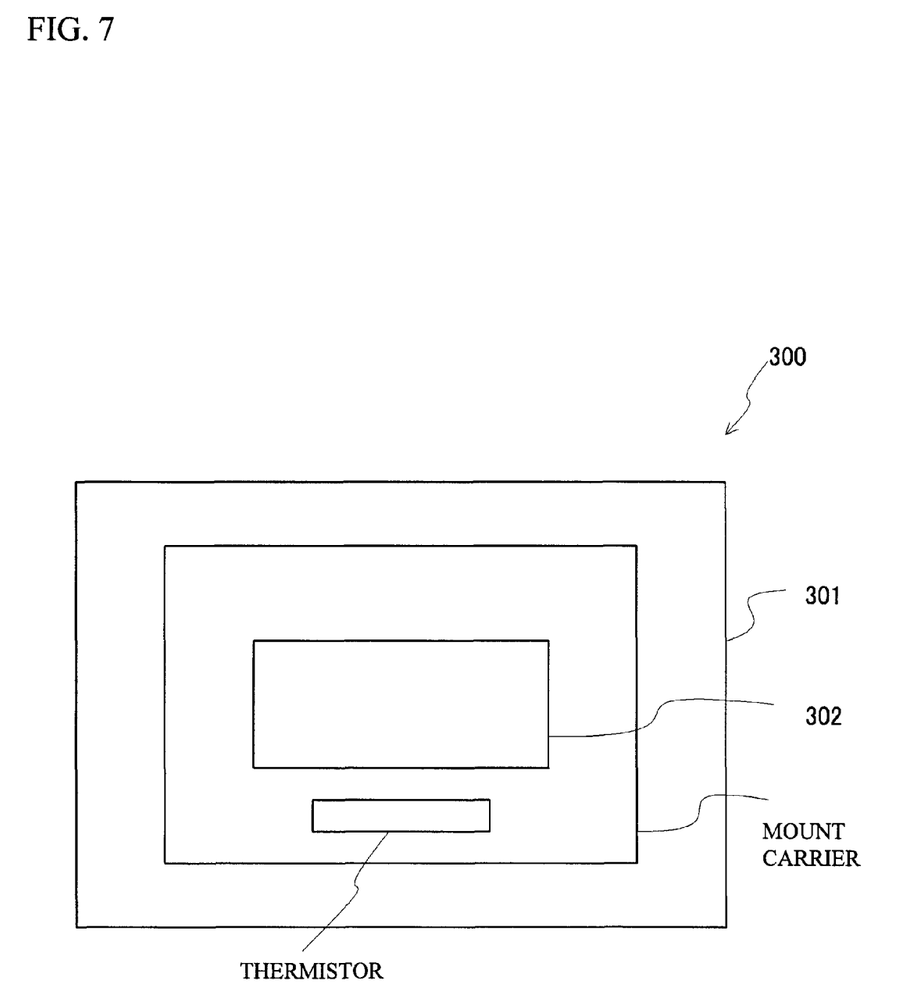
FIG. 7 illustrates an overall structure of a laser module in accordance with a fifth embodiment.

Next, a description will be given of a laser module 300 in accordance with a fifth embodiment of the present invention. FIG. 7 illustrates an overall structure of the laser module 300. As shown in FIG. 7, the laser module 300 has a structure in which a mount carrier is provided on a temperature control device 301, and a laser chip 302 and a thermistor are provided on the mount carrier. The laser chip 302 is the same as the laser chip 200 in accordance with the fourth embodiment.

The temperature control device 301 controls the temperature of the laser chip 302. The temperature control device 301 can control the reflection peak wavelength of the optical waveguide layer 4. Therefore, the laser module 300 can control the lasing wavelength with temperature control of the optical waveguide layer 3 by the thin film resistor 9 and with temperature control of the optical waveguide layer 4 by the temperature control device 301.

Sixth Embodiment

Figure 8:
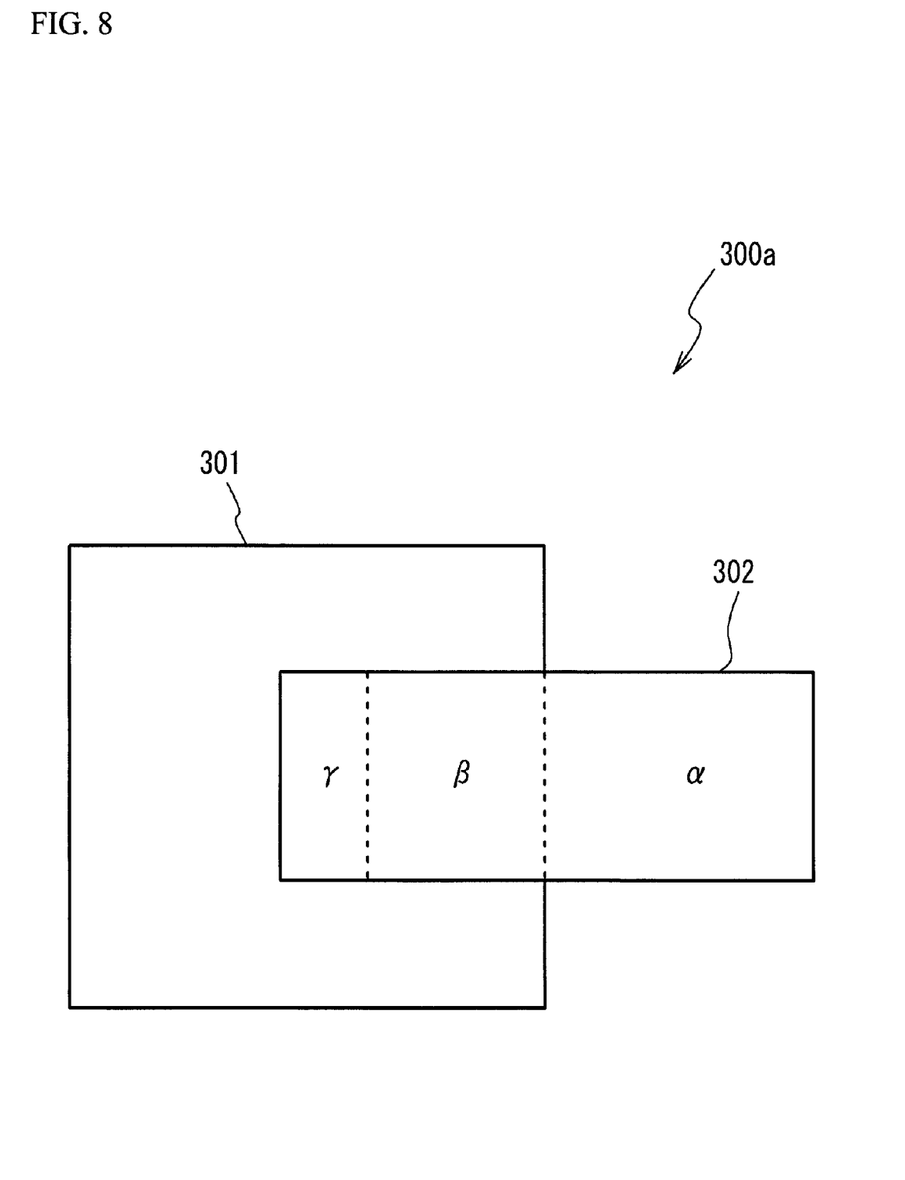
FIG. 8 illustrates an overall structure of a laser module in accordance with a sixth embodiment.

Next, a description will be given of a laser module 300a in accordance with a sixth embodiment of the present invention. FIG. 8 illustrates an overall structure of the laser module 300a. The laser module 300a differs from the laser module 300 shown in FIG. 7 in a position where the laser chip 302 is arranged on the temperature control device 301. As shown in FIG. 8, the PC chip structure γ and the SG-DFB chip structure β are arranged on the temperature control device 301. The SG-DR chip structure α is not arranged on the temperature control device 301.

In this case, the temperature control device 301 controls the temperature of the SG-DFB chip structure β. And the temperature control device 301 can control the reflection peak wavelength of the optical waveguide layer 4. Accordingly, the laser module 300a in accordance with the embodiment can control the lasing wavelength with the temperature control of the optical waveguide layer 3 by the thin film resistor 9 and with the temperature control of the optical waveguide layer 4 by the temperature control device 301. Therefore, the SG-DR chip structure α may not be arranged on the temperature control device 301.

EXAMPLES

The distributed reflectors in accordance with the embodiments mentioned above were modelized. And thermal analysis is performed with a mathematical calculation.

First Example

In a first example, the distributed reflector 100 in accordance with the first embodiment was manufactured. The semiconductor substrate 101 and the cladding region 105 were composed of InP. The optical waveguide layer 106 was composed of InGaAsP crystal. The width W of the mesa semiconductor region 102 was 10 μm. The distance D1 from the upper end of the mesa semiconductor region 102 to the lower end of the optical waveguide layer 106 was 3 μm. The distance D2 from the lower end of the optical waveguide layer 106 to the semiconductor substrate 101 was 17 μm. The height of the mesa semiconductor region 102 (D1+D2) was 20 μm. And the whole height of the semiconductor substrate 101 and the mesa semiconductor region 102 was 100 μm. The width of the semiconductor substrate 101 was 300 μm. The height of the semiconductor substrate 101 was 80 μm.

Second Example

In a second example, the distributed reflector 100 was manufactured similarly to the first example. In the distributed reflector 100 in accordance with the second example, the width W of the mesa semiconductor region 102 was 20 μm. Other structure was the same as the first example.

Third Example

In a third example, the distributed reflector 100 was manufactured similarly to the first example. In the distributed reflector 100 in accordance with the third example, the width W of the mesa semiconductor region 102 was 40 μm, the height of the mesa semiconductor region 102 was 30 μm (D1=3 μm, D2=27 μm), and the height of the semiconductor substrate 101 was 70 μm. Other structure was the same as the first example.

Comparative Example

Figure 9:
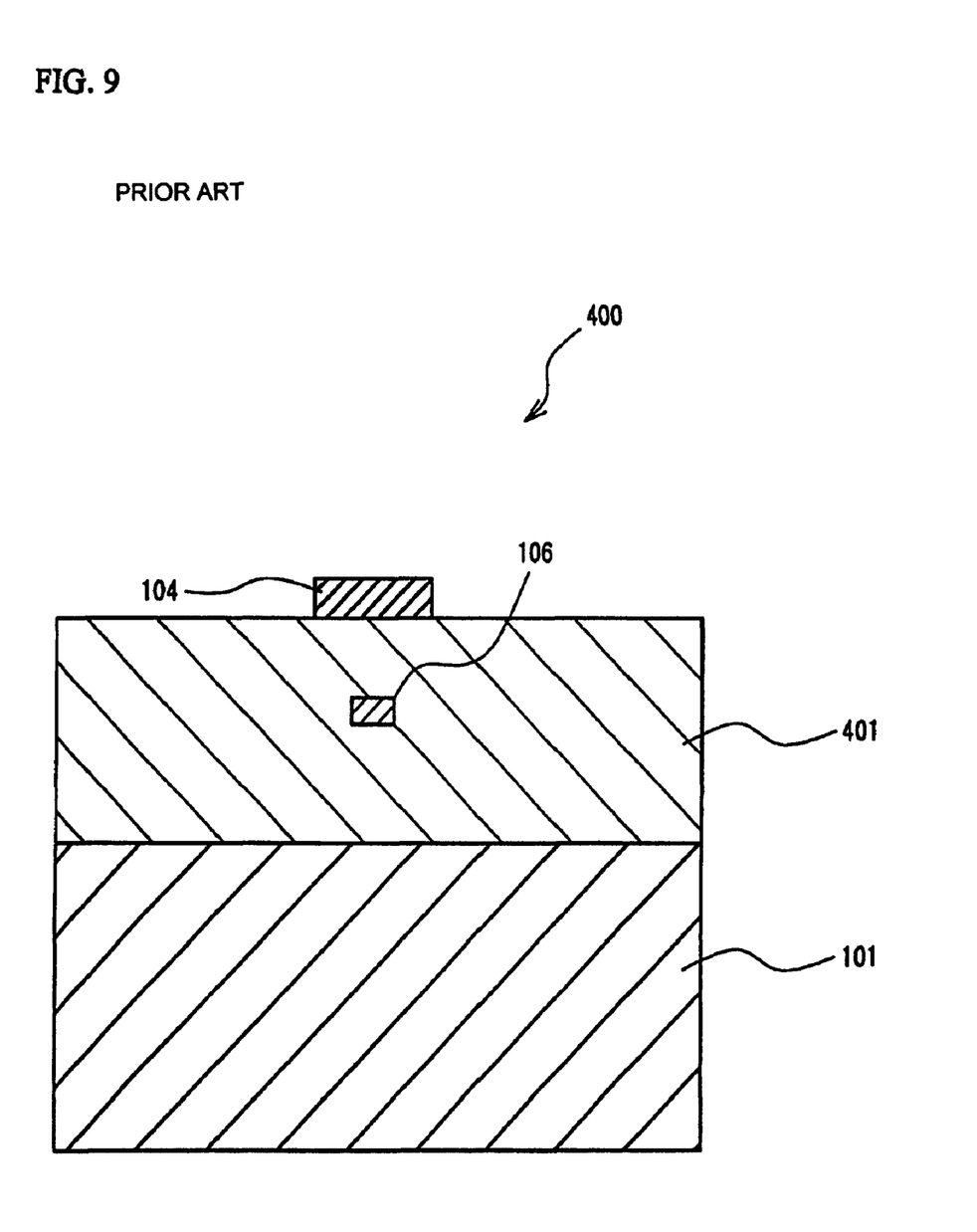
FIG. 9 illustrates a cross sectional view of a distributed reflector in accordance with a comparative example.

In a comparative example, a distributed reflector 400 shown in FIG. 9 was manufactured. FIG. 9 illustrates a cross sectional view of the distributed reflector 400. As shown in FIG. 9, the distributed reflector 400 has a structure in which a semiconductor region 401 having the width as same as that of the semiconductor substrate 101 was provided on the semiconductor substrate 101. That is, the distributed reflector 400 has a structure in which the width of the mesa semiconductor region 102 of the distributed reflector 100 is enlarged to that of the semiconductor substrate 101. In the distributed reflector 400, the distance D1 was 3 μm, the distance D2 was 17 μm, the height of the distributed reflector 400 except for the heater 104 was 100 μm, and the width of the semiconductor substrate 101 and the semiconductor region 401 was 300 μm.

(Analysis)

Figure 10:
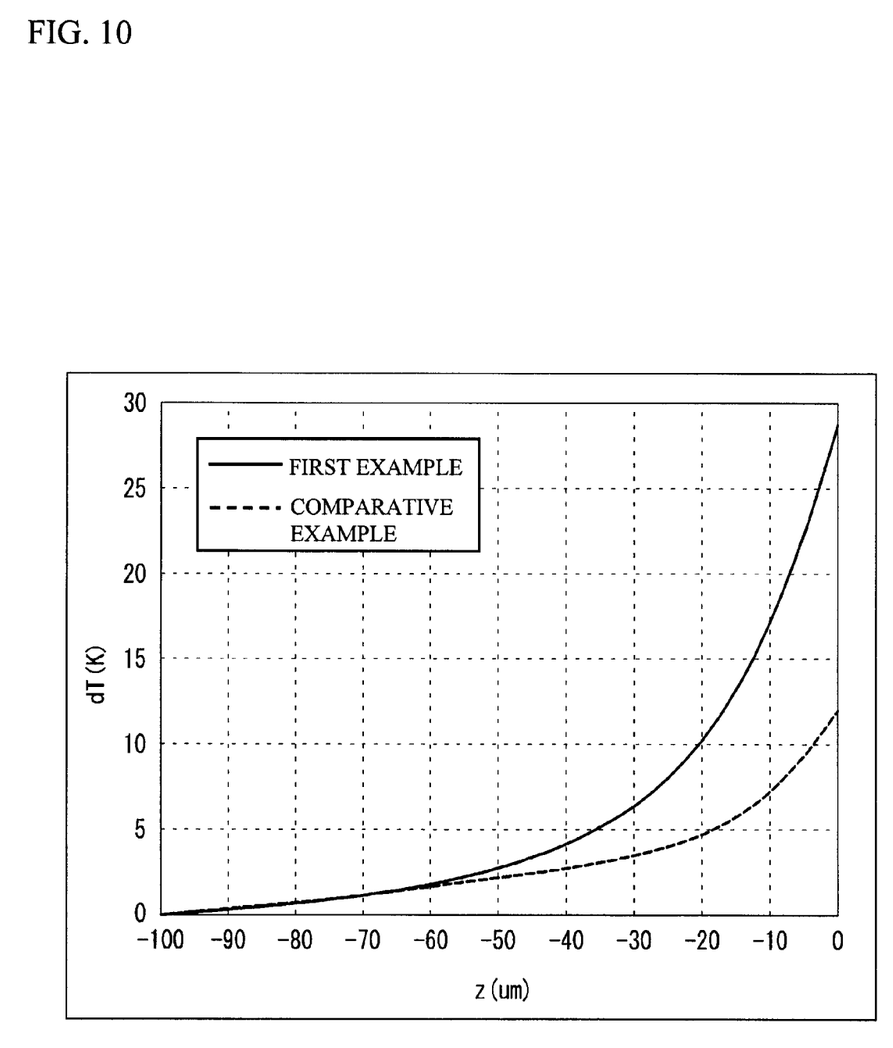
FIG. 10 illustrates a temperature profile of a distributed reflector.

An electrical power was provided to the heater 104, and each of the distributed reflectors was heated, and the temperature profile of each distributed reflector was measured. FIG. 10 illustrates the temperature profile of the distributed reflector in accordance with the first example and the comparative example. The horizontal axis of FIG. 10 indicates a distance z from the bottom of the heater 104 of each distributed reflector. The distance z is −100 μm at the bottom of each distributed reflector (the bottom of the substrate). The vertical axis of FIG. 10 indicates the temperature differential dT from the temperature of the bottom of each distributed reflector. The temperature differential dT is 0 at the bottom of each distributed reflector. A solid line in FIG. 10 indicates the temperature differential dT of the distributed reflector in accordance with the first example, and a dotted line in FIG. 10 indicates the temperature differential dT of the distributed reflector in accordance with the comparative example.

As shown in FIG. 10, the temperature was increased as closer to the upper face in each distributed reflector. The temperature of the distributed reflector 100 in accordance with the first example was increased little by little as closer to the top face thereof and was increased drastically above the position where the distance z is −20 μm, compared to the distributed reflector in accordance with the comparative example. This is because the width of the mesa semiconductor region 102 is smaller than that of the semiconductor substrate 101 and the thermal resistance of the mesa semiconductor region 102 is large. It is thought that the heat intends to diffuse in the horizontal direction in the distributed reflector in accordance with the comparative example because the mesa structure is not provided. On the other hand, it is thought that the heat from the heater 104 is not diffused in a horizontal direction and is conducted in a narrow path because of the mesa structure in the distributed reflector in accordance with the first example. It is therefore possible to heat the optical waveguide layer 106 effectively in the distributed reflector 100 in accordance with the first example.

Figure 11:
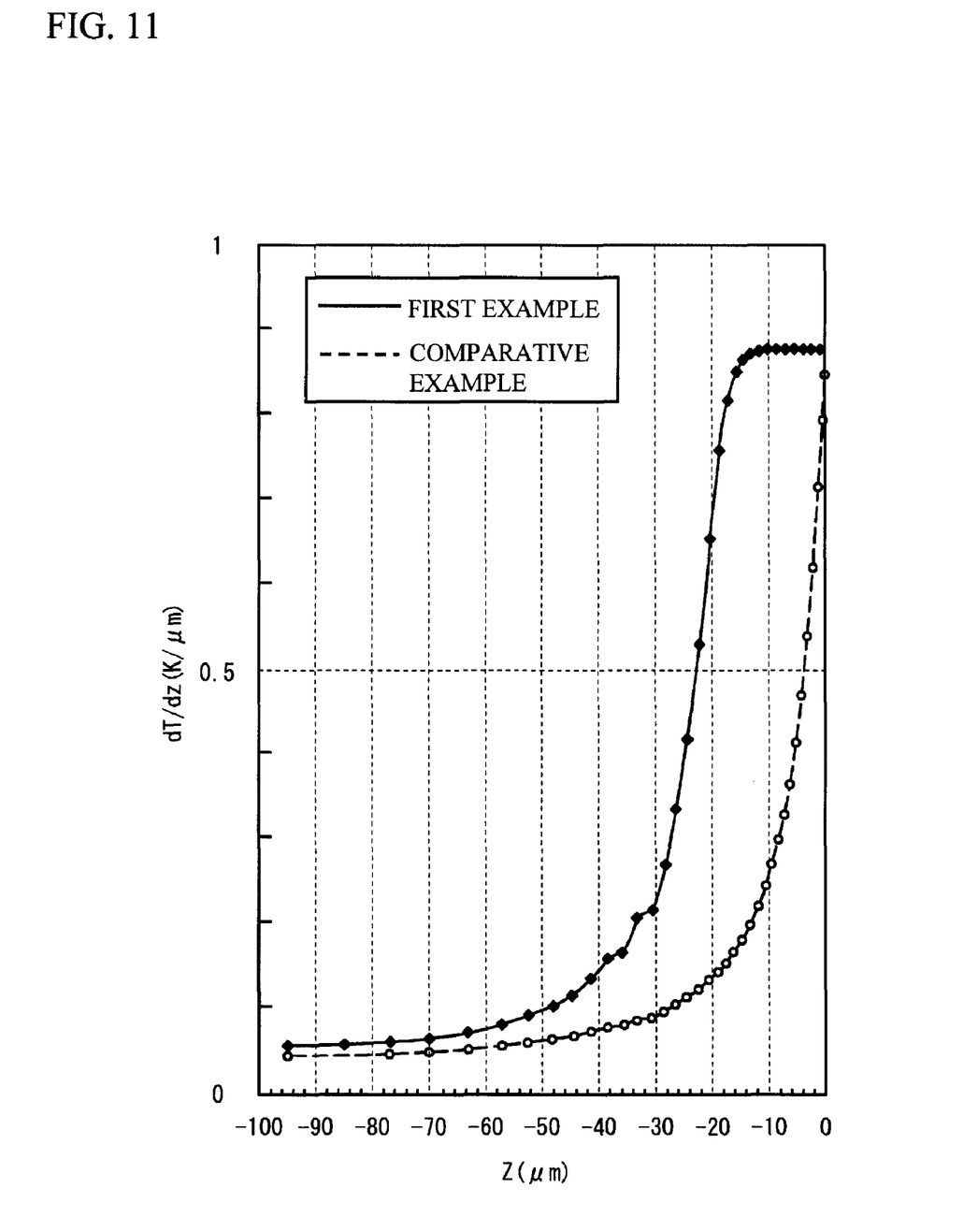
FIG. 11 illustrates a temperature gradient of distributed reflector in accordance with a first example.

Next, the temperature differential dT of each distributed reflector was differentiated with the distance z and the temperature gradient dT/dz was calculated. FIG. 11 illustrates the temperature gradient dT/dz in each distributed reflector. The horizontal axis of FIG. 11 indicates the distance z. The vertical axis of FIG. 11 indicates the temperature gradient dT/dz. A dotted line in FIG. 11 indicates the temperature gradient dT/dz of the distributed reflector in accordance with the comparative example. A solid line in FIG. 11 indicates the temperature gradient dT/dz of the distributed reflector in accordance with the first example.

As shown in FIG. 11, the temperature gradient dT/dz was increased from the bottom to the upper face in each distributed reflector. The temperature gradient dT/dz of the distributed reflector 100 in accordance with the comparative example was decreased drastically as the distance from the bottom of the heater 104 was increased. The gradient dT/dz at the optical waveguide layer 106 (Z=−3 μm) was 70% of that at the bottom of the heater 104.

In contrast, in the distributed reflector 100 in accordance with the first example, the temperature gradient dT/dz kept a maximum value in a range from the bottom of the heater 104 to a given distance from the bottom of the heater 104. The temperature gradient dT/dz kept the maximum value in the optical waveguide layer 106 (z=−3 μm). It is confirmed that the optical waveguide layer 106 is heated effectively in the distributed reflector 100 in accordance with the first example. The temperature gradient dT/dz began to decrease from a position where the distance z is −15 μm, which is a position where the distance from lower end of the mesa semiconductor region is 5 μm. It is therefore necessary that the distance D2 is more than 5 μm in order to obtain the effect of the present invention.

Figure 12:
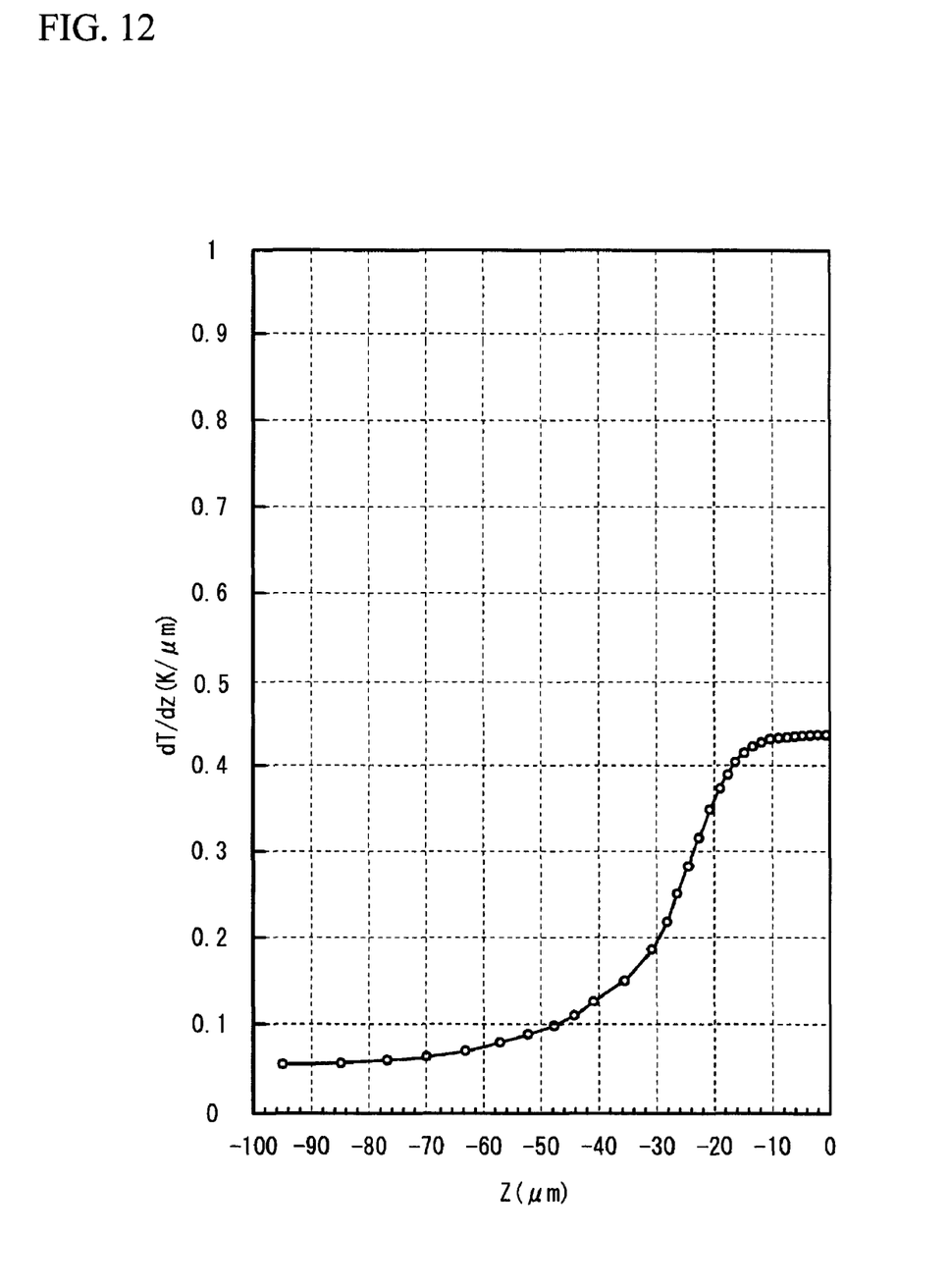
FIG. 12 illustrates a temperature gradient of distributed reflector in accordance with a second example.

FIG. 12 illustrates the temperature gradient dT/dz in the distributed reflector 100 in accordance with the second example. The horizontal axis in FIG. 12 indicates the distance z from the bottom of the heater 104 of the distributed reflector 100 in accordance with the second example. The vertical axis of FIG. 12 indicates the temperature gradient dT/dz. As shown in FIG. 12, the temperature gradient dT/dz began to decrease from a position where the distance z is −10 μm, which is a position where the distance from the lower end of the mesa semiconductor region is 10 μm. It is therefore necessary that the distance D2 is more than 10 μm in order to obtain the effect of the present invention.

Figure 13:
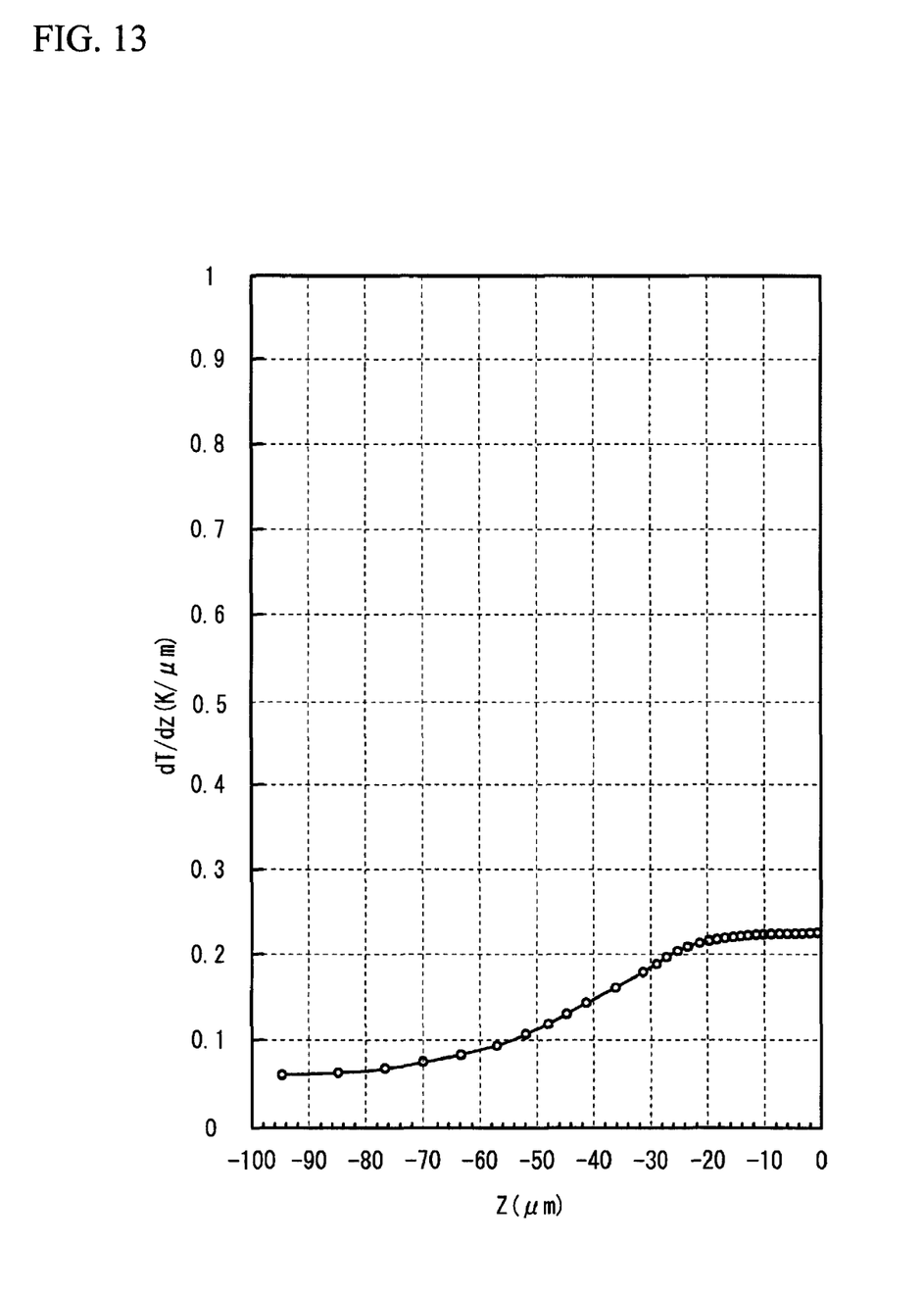
FIG. 13 illustrates a temperature gradient of distributed reflector in accordance with a third example.

FIG. 13 illustrates the temperature gradient dT/dz in the distributed reflector 100 in accordance with the third example. The horizontal axis in FIG. 13 indicates the distance z from the bottom of the heater 104 of the distributed reflector 100 in accordance with the third example. The vertical axis of FIG. 13 indicates the temperature gradient dT/dz. As shown in FIG. 13, the temperature gradient dT/dz began to decrease from a position where the distance z is −10 μm, which is a position where the distance from the lower end of the mesa semiconductor region is 20 μm. It is therefore necessary that the distance D2 is more than 20 μm in order to obtain the effect of the present invention.

Here, the temperature gradient dT/dz in the mesa semiconductor region 102 is inversely proportional to the width W of the mesa semiconductor region 102. And the effect of the present invention is reduced as the width W gets higher. It is therefore necessary that the distance D2 is enlarged as the width W is enlarged. It is necessary that the distance D2 is more than 5 μm when the width W is 10 μm, the distance D2 is more than 10 μm when the width W is 20 μm, and the distance D2 is more than 20 μm when the width W is 40 μm in the distributed reflector 100 in accordance with the examples. It is therefore necessary that the distance D2 is more than half of the width W in order to obtain the effect of the invention. In addition, the optical semiconductor device in accordance with the present invention may not be limited to the distributed reflector or the laser chip having the SG-DR chip structure and the SG-DFB chip structure. The optical semiconductor device or the laser chip in accordance with the present invention may be other optical semiconductor device having a heater controlling a temperature of an optical waveguide.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-095317 filed on Mar. 30, 2006 and Japanese Patent Application No. 2007-075651 filed on Mar. 22, 2007, the entire disclosure of which is hereby incorporated by reference.

What is claimed is:

1. A semiconductor laser comprising:
a semiconductor substrate;
a semiconductor region that has a stripe shape demarcated with a top face and a side face thereof,
the stripe shape having a width smaller than a width of the semiconductor substrate,
an optical waveguide layer being located in the semiconductor region,
a distance from a lower end of the side face of the semiconductor region to the optical waveguide layer being more than half of the width of the semiconductor region,
the optical waveguide including segments in which one region having a diffractive grating and one space region not having the diffractive grating are combined;
a heater provided above the optical waveguide layer; and
a gain region that provides a gain to a light reflected by the segments and has a width larger than that of the semiconductor region.

2. The semiconductor laser as claimed in claim 1, wherein the width of the semiconductor region is a width at a region of the semiconductor region where the optical waveguide layer is positioned.

3. The semiconductor laser as claimed in claim 1, wherein:
the semiconductor region has an upper cladding layer and a lower cladding layer,
the optical waveguide layer being between the upper cladding layer and the lower cladding layer; and
the upper cladding layer, the lower cladding layer and the semiconductor substrate are composed of InP.

4. The semiconductor laser as claimed in claim 1, wherein an air region is adjacent to a side face of the semiconductor region.

5. The semiconductor laser as claimed in claim 1, wherein the side face of the semiconductor region is covered with an insulator having a thermal conductivity lower than that of the semiconductor region.

6. The semiconductor laser as claimed in claim 5, wherein the insulator is composed of polyimide.

7. The semiconductor laser as claimed in claim 1, further comprising a temperature control device where the gain region and the semiconductor region are mounted.

8. The semiconductor laser as claimed in claim 7, further comprising a temperature control device mounting partly the substrate of the gain region side.

9. The semiconductor laser as claimed in claim 1, wherein the lower end of the side face of the semiconductor region is positioned at a position lower than a surface of the semiconductor substrate.

10. The semiconductor laser as claimed in claim 1 further comprising an optical intensity controller that is optically coupled to the optical waveguide layer and the gain region and absorbs or amplifies a light.

11. The semiconductor laser as claimed in claim 10, wherein the optical waveguide layer, the gain region and the optical intensity controller are coupled in this order.

* * * * *